(12) United States Patent
Azdasht

(10) Patent No.: US 9,327,360 B2
(45) Date of Patent: May 3, 2016

(54) METHOD AND DEVICE FOR CONTACTING, POSITIONING AND IMPINGING A SOLDER BALL FORMATION WITH LASER ENERGY

(75) Inventor: Ghassem Azdasht, Berlin (DE)

(73) Assignee: Pac Tech—Packaging Technologies GMBH, Nauen (DE)

( * ) Notice: Subject to any disclaimer, the term of this patent is extended or adjusted under 35 U.S.C. 154(b) by 1230 days.

(21) Appl. No.: 12/523,788

(22) PCT Filed: Jan. 24, 2008

(86) PCT No.: PCT/DE2008/000128
§ 371 (c)(1),
(2), (4) Date: Jul. 20, 2009

(87) PCT Pub. No.: WO2008/089743
PCT Pub. Date: Jul. 31, 2008

(65) Prior Publication Data
US 2010/0051589 A1    Mar. 4, 2010

(30) Foreign Application Priority Data
Jan. 24, 2007   (DE) .......................... 10 2007 004 543

(51) Int. Cl.
*B23K 9/16*    (2006.01)
*B23K 31/00*   (2006.01)
(Continued)

(52) U.S. Cl.
CPC ............. *B23K 1/0056* (2013.01); *B23K 1/0016* (2013.01); *B23K 3/0623* (2013.01);
(Continued)

(58) Field of Classification Search
CPC ............. B23K 1/0016; B23K 1/0056; B23K 2201/40; B23K 3/0623; H05K 2201/10727; H05K 2203/0195; H05K 2203/0285; H05K 2203/041; H05K 2203/082; H05K 2203/107; H05K 3/3442; H05K 3/3478; H05K 3/3494
USPC .......... 219/72, 121.64, 73, 73.1, 73.11, 73.2, 219/76.1, 85.1, 85.12–85.16, 86.1, 219/86.22–86.24, 87, 121.11, 121.15, 219/121.25, 121.6, 121.61–121.66, 129, 219/85.21, 85.22, 85.2; 228/180.21, 228/180.22, 254, 108.1, 246, 110.1, 111.5, 228/114.5, 184, 221, 228, 262, 262.42, 228/262.61, 262.72, 262.9
See application file for complete search history.

(56) References Cited

U.S. PATENT DOCUMENTS 3,382,564 A  *  5/1968  Gallentine ................. 228/173.5
3,444,352 A  *  5/1969  Ogden et al. ................. 219/73.2
(Continued)

FOREIGN PATENT DOCUMENTS

JP         9270442 A     10/1997
JP         10214859 A    8/1998
(Continued)

OTHER PUBLICATIONS

"PCT International Search Report dated Jun. 13, 2008 for PCT/DE2008/000128, from which the instant application claims priority," 3 pgs.
(Continued)

*Primary Examiner* — Dana Ross
*Assistant Examiner* — Ket D Dang
(74) *Attorney, Agent, or Firm* — Fredrikson & Byron, P.A.

(57) ABSTRACT

The invention relates to a method and a device for contacting a solder ball formation, in which a plurality of contact mouthpieces arranged in a formation is used to pick up a solder ball formation with a composition reflecting the relative arrangement of the contact mouthpieces from a solder ball reservoir comprising a multitude of randomly distributed solder balls, the solder ball formation is placed on contact points by means of the contact mouthpieces for subsequently contacting, and subsequently the solder balls are impinged with laser energy by means of the contact mouthpieces for thermal connection with the contact points.

5 Claims, 3 Drawing Sheets

Figure 1:
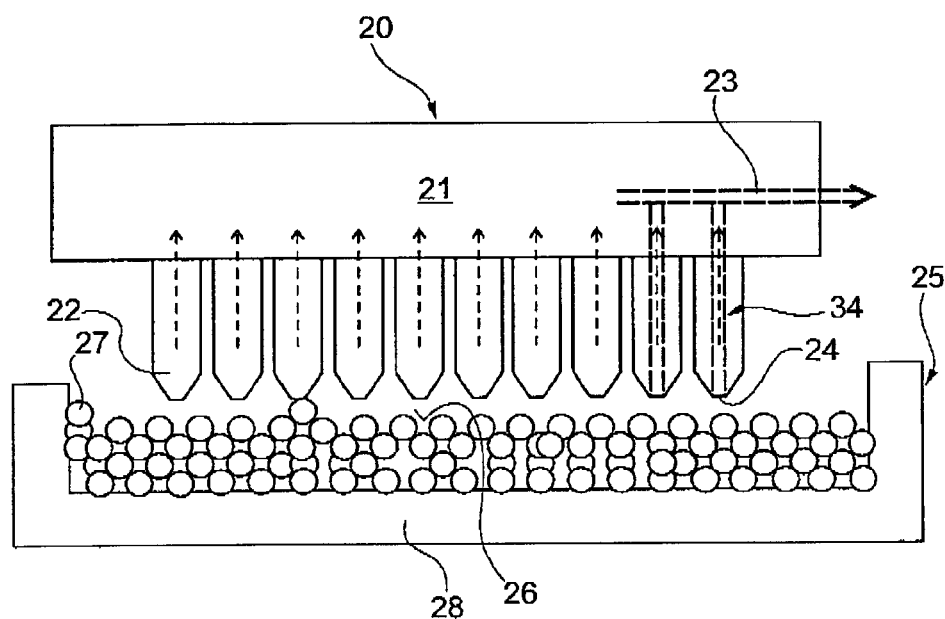

(51) Int. Cl.
*B23K 1/005* (2006.01)
*B23K 1/00* (2006.01)
*B23K 3/06* (2006.01)
*H05K 3/34* (2006.01)

(52) U.S. Cl.
CPC ............ *H05K3/3442* (2013.01); *H05K 3/3478* (2013.01); *H05K 3/3494* (2013.01); *B23K 2201/40* (2013.01); *H05K 2201/10727* (2013.01); *H05K 2203/0195* (2013.01); *H05K 2203/0285* (2013.01); *H05K 2203/041* (2013.01); *H05K 2203/082* (2013.01); *H05K 2203/107* (2013.01); *Y02P 70/613* (2015.11)

(56) References Cited

U.S. PATENT DOCUMENTS

| | | | | |
|---|---|---|---|---|
| 3,670,139 | A * | 6/1972 | Pandjiris et al. | 219/73.2 |
| 4,162,387 | A * | 7/1979 | De Candia | 219/79 |
| 4,256,947 | A * | 3/1981 | De Candia | 219/79 |
| 4,963,714 | A | 10/1990 | Adamski et al. | |
| 5,565,119 | A * | 10/1996 | Behun et al. | 219/121.63 |
| 5,687,901 | A * | 11/1997 | Hoshiba et al. | 228/246 |
| 5,708,251 | A * | 1/1998 | Naveh | 219/121.66 |
| 5,741,410 | A | 4/1998 | Tsurushima | |
| 5,961,858 | A * | 10/1999 | Britnell | 219/121.63 |
| 6,059,176 | A * | 5/2000 | Azdasht et al. | 228/254 |
| 6,204,469 | B1 * | 3/2001 | Fields et al. | 219/121.6 |
| 6,460,755 | B1 | 10/2002 | Inoue et al. | |
| 6,533,159 | B1 * | 3/2003 | Cobbley et al. | 228/20.1 |
| 6,642,485 | B2 * | 11/2003 | Goenka et al. | 219/400 |
| 6,769,599 | B1 | 8/2004 | Momeni et al. | |
| 2005/0051521 | A1 | 3/2005 | Shindo et al. | |
| 2006/0065641 | A1 * | 3/2006 | Shindo et al. | 219/121.63 |
| 2006/0065642 | A1 | 3/2006 | Shindo et al. | |
| 2006/0108400 | A1 * | 5/2006 | Fukaya et al. | 228/227 |
| 2006/0193084 | A1 * | 8/2006 | Satoh et al. | 360/234.5 |
| 2006/0219760 | A1 * | 10/2006 | Wagoh et al. | 228/248.1 |
| 2007/0102485 | A1 * | 5/2007 | Fukaya et al. | 228/101 |

FOREIGN PATENT DOCUMENTS

| | | |
|---|---|---|
| JP | 2002118133 A | 4/2002 |
| JP | 200581406 A | 3/2005 |
| JP | 2005167293 A | 6/2005 |
| JP | 2006221690 A | 8/2006 |

OTHER PUBLICATIONS

Office Action, with English translation, dated May 11, 2012 for related JP No. JP2009-546649.

* cited by examiner

METHOD AND DEVICE FOR CONTACTING, POSITIONING AND IMPINGING A SOLDER BALL FORMATION WITH LASER ENERGY

RELATED APPLICATIONS

This application is a 35 U.S.C. 371 national stage filing from International Application No. PCT/DE2008/000128 filed Jan. 24, 2008, which claims priority to German Patent Application No. 10 2007 004 543.5, filed Jan. 24, 2007, the teachings of which are incorporated herein by reference.

The present invention relates to a method for contacting a solder ball formation, wherein, a plurality of contact mouthpieces arranged in a formation is used to pick up a solder ball formation with a composition reflecting the relative arrangement of the contact mouthpieces from a solder ball reservoir comprising a multitude of randomly distributed solder balls, the solder ball formation is placed on contact points by means of the contact mouthpieces for subsequent contacting, and subsequently the solder balls are impinged with laser energy by means of the contact mouthpieces for thermal connection with the contact points. In addition, the invention relates to a device suited in particular for implementing said method.

In order to contact components, and in particular groups of components, to be contacted in an electrically conductive manner, a process for solder ball contacting has become established in practice where solder balls are individually isolated from a solder ball reservoir, are subsequently placed on the contact points of the contact partners, and finally are melted through impingement with thermal energy to produce the desired electrically conductive connection. In particular with respect to industrial applications of the known method, it is crucial to be able to execute the multitude of the aforementioned procedural steps in as short a time as possible given the highest possible number of solder connections to be established between contact partners. This is why there have already been past attempts at removing and isolating solder balls from a solder ball reservoir in order to arrange a plurality of solder balls as required for subsequent contacting in a joint procedural step. Removal devices making it possible to remove the desired number of solder balls given a simultaneously isolating alignment of the solder balls have been developed for this purpose.

Also already known in the art is to use such a removal device for placing the solder balls on contact points of a contacting device arranged correspondingly to the arrangement of solder balls in the removal device. In order to subsequently contact the solder balls placed on the contact points, it has previously been necessary to impinge the solder balls with thermal energy by means of a contacting device independent of the removal and placement device. As a result, the necessary relative alignment between the connecting device and the solder balls or between the connecting device and the removal/placing device holding the solder balls must first be established before the actual connecting process, i.e., before introducing energy into the contact points via the contacting device. This is associated with a corresponding outlay for adjustment and handling, which additionally requires the appropriate time to perform.

Therefore, the object of the present invention is to propose a method, respectively a device for contacting a solder ball formation that simplifies and accelerates the contacting of a solder ball formation.

In the method according to the invention, the steps of isolating and picking up a plurality of solder balls arranged in a formation from a solder ball reservoir, as well as placing the solder balls arranged in the formation on the contact points, as well as the subsequent contacting of the solder balls arranged on the contact points by impinging the solder balls with laser energy take place by means of the contact mouthpieces picking up the solder balls from the solder ball reservoir.

While implementing the method according to the invention, it is hence no longer necessary to use various devices for executing the various procedural steps. Instead, the method according to the invention involves isolating, picking up and placing the solder balls on the contact points, and performing the actual contacting process by means of one and the same contacting device.

It is especially advantageous for the contact mouthpieces for picking up the solder balls from the solder ball reservoir to be exposed to a vacuum.

It is also especially advantageous that the solder ball reservoir be exposed to ultrasound while picking up the solder balls from the solder ball reservoir, so as to achieve a statistically uniform distribution density of the solder balls in the reservoir on the one hand, and cause the solder balls to jump up in response to ultrasound oscillations on the other hand, thereby generating gaps between the solder balls to simplify picking up the solder balls in the solder ball reservoir.

If the contact mouthpieces are pivoted relative to the contact arrangements formed from the solder balls and the contact points after the solder balls have been placed on the contact points, it is possible to select a direction of solder ball impingement with energy by the contacting device that deviates from the feed direction during the placement process, so as to enable an optimal provision of energy to the contact points.

It is here particularly advantageous for the contact mouthpieces to be pivoted relative to the contact arrangements while maintaining the contact pressure, in such a way as to enable a contacting of solder balls also after executing the pivoting procedure without the intermediate formation of a contact gap.

In another advantageous variant of the method, the solder balls are coated with a flow agent after the solder balls have been picked up from the solder ball reservoir and before the solder balls are placed on the contact points, so as to further improve the quality of the soldered joints established between the contact partners via contacting, if possible.

If the coating process takes place by at least partially submerging the solder balls in a flow agent reservoir, meaning that the solder balls of the solder ball formation are quasi provided with a flow agent application in a dipping process, then coating can take place without any major additional time or equipment outlay as the contact mouthpieces are transferred from the solder ball reservoir to the contact points.

In order to achieve a special level of quality assurance, it is also possible to use the laser device that interacts with the contact mouthpieces to carry out a check for positioning and flaws before performing the thermal connecting process by melting the solder balls immediately after placement.

The device according to the invention exhibits a plurality of contact mouthpieces arranged in a formation and a solder ball reservoir for accommodating a multitude of solder balls, wherein the contact mouthpieces are used both for picking up the solder balls from the solder ball reservoir and placing the solder balls on the contact points, as well as for impinging the solder balls with laser energy to thermally connect the solder balls with the contact points.

In a preferred embodiment of the invention, vacuum channels are incorporated in the contact mouthpieces to expose the solder balls to a vacuum.

It is further advantageous to arrange a device for exposing the solder ball reservoir to ultrasound oscillations on the solder ball reservoir.

Arranging the contact mouthpieces to the contacting device so as to be pivotable makes it possible to a particularly great extent to adjust the alignment of the contact mouthpieces to the circumstances or the relative arrangement of the contact points.

The process of jointly handling the contact mouthpieces in a formation is simplified by arranging the contact mouthpieces on a carrier device of the contacting device.

It is especially advantageous for the contact mouthpieces to be arranged in rows or matrices, so that a standard arrangement of the contact mouthpieces corresponding to most relative arrangements of contact points is provided or can be set.

It is particularly advantageous for the contact mouthpieces to have a variable relative arrangement on the carrier device, for example, so that arrangements of contact points deviating from a row or matrix arrangement can be impinged with the contacting devices arranged on the carrier device, whether individually or in groups.

In terms of providing a space-saving and functionally integrated design for the contact mouthpieces, it is particularly advantageous for the contact mouthpieces to exhibit an optical waveguide routed in the vacuum channel for impinging the solder balls with laser energy.

If the optical waveguide is designed as an optical fiber, the optical fiber can simultaneously be used to introduce the laser energy into the contact mouthpieces, and not only to route the laser energy inside the contact mouthpieces. In addition, designing the optical waveguide as an optical fiber also makes it possible to use the optical waveguide as a plunger device, so that any contaminants that have formed on the discharge opening of the contact mouthpiece can be removed.

One especially simple and effective way to synchronize the optical waveguides involves connecting the optical fibers of several contact mouthpieces to a single laser source.

In particular given contact points of different design to be processed in a joint fitting and soldering step, it is advantageous to combine the optical fibers of the contact mouthpieces into several optical fiber groups, which are at least partially connected to various laser sources. The laser sources can here emit laser light of differing intensity.

A preferred embodiment of the device will be described in greater detail below based on the drawings in order to explain the method that can be executed with this device.

Figure 2:
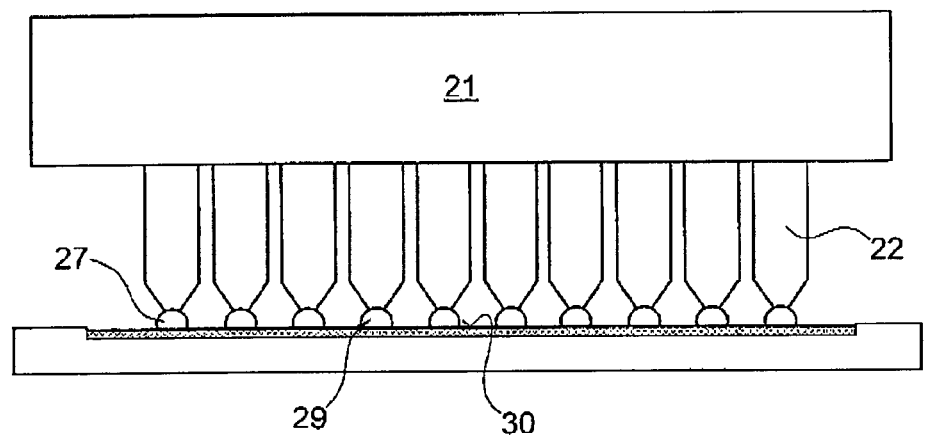
Figure 3:
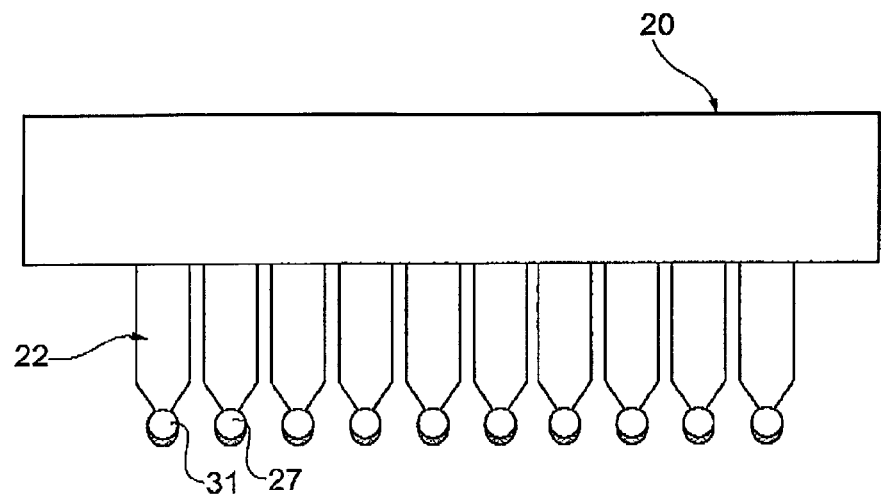
Figure 4:
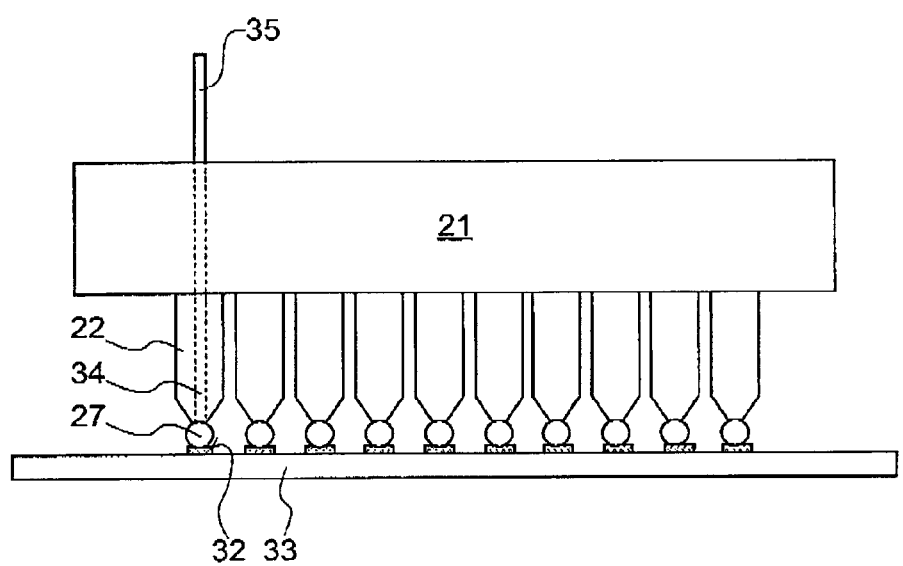
Figures 5, 6:
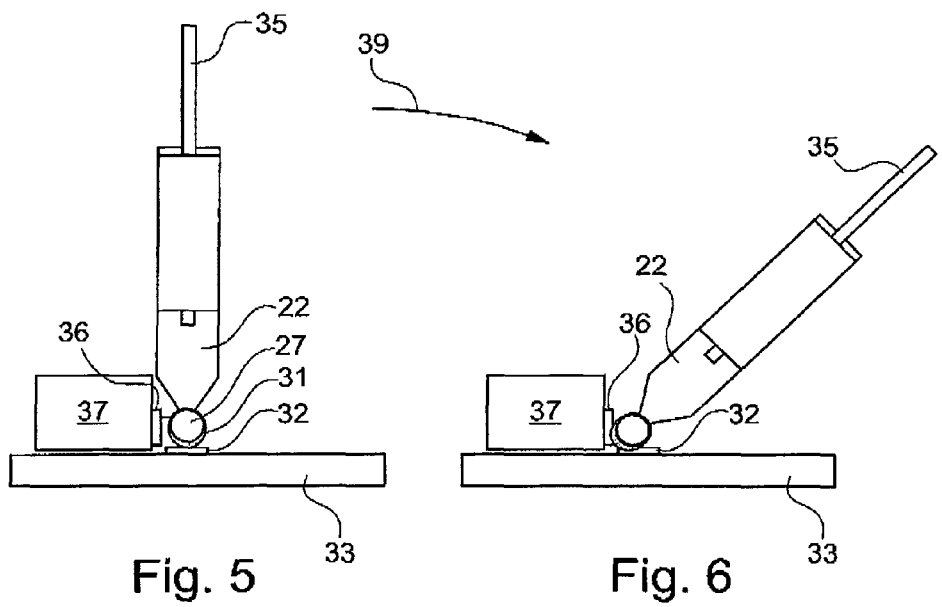
Figure 7:
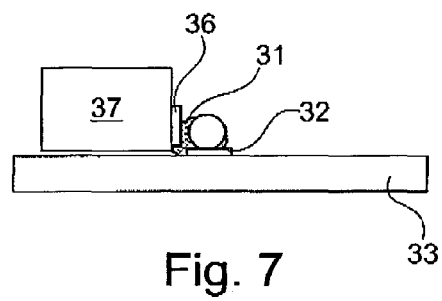
Figure 8:
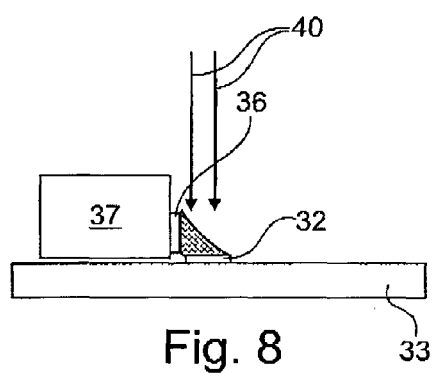

Shown on:

FIG. 1: is a solder ball contacting device while picking up solder balls from a solder ball reservoir;

FIG. 2 is the solder ball contacting device while coating solder balls with flow agent;

FIG. 3: is the solder ball contacting device with solder balls arranged on contact mouthpieces and coated with flow agent;

FIG. 4: is the solder ball contacting device while impinging the solder balls with laser energy;

FIG. 5: is a contact mouthpiece of the solder ball contacting device while placing a solder ball against a contact pairing;

FIG. 6: is the contact mouthpiece shown on FIG. 5 in a pivoted contacting position;

FIG. 7: is a solder ball placed on a contact surface pairing;

FIG. 8: is the contact surface pairing shown on FIG. 7 while impinging the solder ball with laser energy.

FIG. 1 shows a solder ball contacting device 20 with a plurality of contact mouthpieces 22, which are here designed as hollow needles and are arranged on a carrier device 21. The individual contact mouthpieces 22 are each connected to a vacuum device 23, so that a vacuum is generated given the suitable exposure of the contact openings 24 of the contact mouthpiece 22.

The solder ball contacting device 20 is located above a solder ball reservoir 26, which is arranged in a holding tank 25 and has a multitude of solder balls 27. The holding tank 25 can be impinged with ultrasound by means of an ultrasound device not shown in any greater detail here, so as to expose the holding tank 25, or at least partial areas of the holding tank 25, such as the tank floor 28, to an oscillation amplitude. The oscillation amplitude is conveyed to the solder balls 27 of the solder ball reservoir 26, and causes the latter to move back and forth relative to the holding tank 25. This back and forth movement increases the distances between the solder balls 27 on the one hand, while a statistically uniform distribution of the solder balls 27 in the holding tank 25 takes place on the other hand, without localized bunching taking place.

To facilitate the aspiration of the solder balls 27 against the contact opening 24 while exposing the contact mouthpieces 22 to a vacuum, the tank floor 28 can in particular be provided with air holes.

As shown in FIG. 2, it is possible to provide solder balls 27 arranged on the solder ball contacting device 20 individually in a solder ball formation 29 with a flow agent coating 31 (see FIG. 5) through at least partial submersion in a flow agent reservoir 30, as depicted in FIG. 3.

FIG. 4 now shows how the solder balls 27 arranged in the solder ball formation 29 are placed on contact surfaces 32 of a substrate 33, for example one designed as an electronic component.

By way of example on the outer left contact mouthpiece 22, FIG. 4 also depicts an impingement channel 34 of the contact mouthpiece 22, which is used on the one hand for connection with the vacuum device 23, as already explained above, and on the other hand accommodates an end section of the optical waveguide here designed as an optical fiber 35. The optical fiber 35 is routed out of the top of the contact mouthpiece or carrier device 21, and its terminal end is connected to a laser source not shown in any greater detail here, or a light injector connected with a laser source. This light injector can be designed as a distributor, which distributes the laser energy emitted by a laser source to the plurality of optical fibers of the plurality of contact mouthpieces 22.

The solder ball contacting device 20 shown on FIG. 1 exhibits contact mouthpieces 22 arranged in rows. In addition, the solder ball contacting device 20 can also be designed in such a way as to exhibit a matrix arrangement of contact mouthpieces 22, or an array of contact mouthpieces 22 exhibiting a one or two-dimensional layout of contact mouthpieces corresponding to the respective arrangement of the contact surfaces of the contact substrate to be contacted.

FIGS. 5 and 6 show a placement process followed by contacting, wherein the solder ball contacting device 20 depicted on FIG. 4 that is used has contact mouthpieces 22 arranged in rows. Accordingly, in the exemplary embodiment shown, ten contact mouthpieces are arranged perpendicular to the plane of projection, and carry a formation of ten solder balls 27 in all, placing it on a corresponding arrangement of ten contact surfaces 32 of the contact substrate 33. The contact surfaces 32 in conjunction with a contact surface 36 of an electronic component 37 to be contacted with the substrate 33 each form contact pairings 38 on contact points 41 with the contact surfaces 32 and 36 arranged spatially relative to each other.

As shown on FIG. 5, the solder ball contacting device 20 is here used in a first step to abut the solder balls 27 against the contact surfaces 32 of the substrate 33 here arranged in a horizontal plane. The solder ball contacting device 20 or the carrier device 21 is then pivoted around a swiveling axis 39, as shown on FIG. 6, so that at the end of the pivoting process the solder balls 27 of the solder ball formation come to lie against both the contact surfaces 32 of the substrate 33 and the contact surfaces 36 of the component 37 arranged in a vertical plane. In this position of the solder ball contacting device 20 or formation of the contact mouthpieces 22 depicted on FIG. 6, the solder balls 27 are then impinged with laser energy via the optical fiber 35.

As shown on FIGS. 7 and 8, it is alternatively possible to remove the solder ball contacting device 20 from the contact point 41 after the solder balls 27 have been placed in contact with the contact surfaces 32 and 36 of the contact surface pairing 38, in order to impinge the solder balls 27 with laser energy 40 as shown on FIG. 8, without there being any physical contact between the solder ball contacting device 20 and the solder balls 27. As depicted on FIG. 7, the abutment of solder balls 27 against the contact surfaces 32 and 36 of the contact pairs 38 established by the solder ball contacting device 20 is achieved via the adhesive action of the flow agent coating 31 or another adhesive agent.

The invention claimed is:

1. A method for contacting a solder ball formation, with contact points, the method comprising the following steps:
   providing a solder ball reservoir with a multitude of randomly distributed solder balls;
   providing a plurality of contact mouthpieces arranged in a formation wherein the plurality of contact mouthpieces can impinge laser energy;
   picking up a plurality of solder balls from the solder ball reservoir using the plurality of contact mouthpieces;
   placing the solder balls picked up by the plurality of contact mouthpieces on the contact points to form a contact arrangement;
   pivoting the plurality of contact mouthpieces relative to the contact arrangements formed by the solder balls and the contact points, after the solder balls have been placed on the contact points while maintaining contact pressure; and
   impinging the placed solder balls with laser energy by the plurality of contact
   mouthpieces to thermally couple the solder balls with the contact points.

2. The method according to claim 1 further comprising the step of exposing the contact mouthpieces to a vacuum.

3. The method according to claim 1 further comprising the step of exposing the solder ball reservoir to ultrasound while the solder balls are picked up by the plurality of contact mouthpieces from the solder ball reservoir.

4. The method according to claim 1 further comprising the step of coating the solder balls with a flow agent after the solder balls have been picked up from the solder ball reservoir and before the solder balls are placed on the contact points.

5. The method according to claim 4 wherein the step of coating comprises at least partially submerging the solder balls in a flow agent reservoir.

* * * * *